United States Patent
Endo et al.

[11] Patent Number: 6,074,804
[45] Date of Patent: Jun. 13, 2000

[54] PATTERN FORMATION METHOD

[75] Inventors: Masayuki Endo, Osaka; Toshinobu Ishihara, Niigata; Toru Kubota, Niigata; Katsuya Takemura, Niigata, all of Japan

[73] Assignees: Matsushita Electric Industrial Co., Ltd., Osaka; Shin-Estu Chemical Co., Ltd., Tokyo, both of Japan

[21] Appl. No.: 09/102,024

[22] Filed: Jun. 22, 1998

[30] Foreign Application Priority Data

Jun. 26, 1997 [JP] Japan .................................. 9-170059

[51] Int. Cl.⁷ ........................................................ G03F 7/00
[52] U.S. Cl. ............................ 430/322; 430/323; 430/324
[58] Field of Search .................................. 430/322, 323, 430/324

[56] References Cited

U.S. PATENT DOCUMENTS

| 4,377,631 | 3/1983 | Toukhy .................................. 430/192 |
| 5,091,290 | 2/1992 | Rolfson .................................. 430/327 |
| 5,312,717 | 5/1994 | Sachdev et al. ........................ 430/313 |
| 5,391,913 | 2/1995 | Mino et al. ............................. 257/632 |
| 5,550,007 | 8/1996 | Taylor ..................................... 430/314 |
| 5,702,767 | 12/1997 | Peterson et al. ..................... 427/407.1 |

FOREIGN PATENT DOCUMENTS

| 0278996 | 2/1987 | European Pat. Off. . |
| 0260977 | 9/1987 | European Pat. Off. . |
| 0 515 212 A1 | 11/1992 | European Pat. Off. . |
| 0 691 674 A2 | 1/1996 | European Pat. Off. . |
| 0757290 | 2/1996 | European Pat. Off. . |
| 0837369 | 10/1997 | European Pat. Off. . |
| 0 291 670 | 11/1998 | European Pat. Off. . |
| 58-188132 | 2/1983 | Japan . |
| 6-35000 | 12/1994 | Japan . |
| 09102458 | 4/1997 | Japan . |
| 2167686 | 2/1984 | United Kingdom . |

OTHER PUBLICATIONS

Pinnavaia T.J., et al., "Triorganosilicon Acetylacetonates. Enol Ether Isomerism and Stereochemical Liability" Journal of American Chemical Society, vol. 92, No. 15, Jul. 29 1999, pp. 4544–4550.

Notice of Reasons for Rejection in Taiwanese Application No. 85108702 dated Dec. 15, 1998.

*Primary Examiner*—Sharon Gibson
*Assistant Examiner*—Nicole Barreca
*Attorney, Agent, or Firm*—McDermott, Will & Emery

[57] ABSTRACT

After forming a resist film by coating a semiconductor substrate with a resist, pattern exposure is conducted by irradiating the resist film with ArF excimer laser with a mask used. A silylation agent of 4-dimethylsiloxy-3-penten-2-one is supplied onto the surface of the resist film having been subjected to the pattern exposure, thereby forming a silylated layer in an unexposed portion of the resist film. The resist film is etched by using the silylated layer as a mask, so as to remove an exposed portion of the resist film. Thus, a resist pattern can be formed out of the resist film.

6 Claims, 7 Drawing Sheets

PATTERN FORMATION METHOD

BACKGROUND OF THE INVENTION

The present invention relates to a pattern formation method for forming a resist pattern on a semiconductor substrate in a manufacturing process of a semiconductor device.

In accordance with development of higher integration of semiconductor integrated circuits, there is a demand for further refinement of the semiconductor integrated circuits, and exposing light having a much shorter wavelength is desired in lithography technique. Specifically, as exposing light used in pattern exposure during the formation of a resist pattern having a line width smaller than 0.15 μm, ArF excimer laser is used because its wavelength is sufficiently short for attaining high resolution.

The ArF excimer laser, however, has a problem that the depth of focus is small because of its short wavelength.

Therefore, as a pattern formation method using the lithography technique, a silylation process, in which a resist pattern is formed by conducting etching on a resist film with a silylated layer formed on the resist film used as a mask, has been proposed.

A conventional pattern formation method using the silylation process will now be described with reference to FIGS. 7(a) through 7(d).

First, after a resist film 2 with a thickness of 0.7 μm is formed by coating a semiconductor substrate 1 with a resist material (such as SAL-601; manufactured by Shipley Far East Company) as is shown in FIG. 7(a), pattern exposure is conducted, as is shown in FIG. 7(b), by irradiating the resist film 2 with ArF excimer laser 4 through a mask 3 having a desired pattern shape.

In an exposed portion 2a of the resist film 2, crosslinkage is caused in the resist material through the exposure. An example of the crosslinkage caused when the resist material does not include a cross linking agent is represented by the following chemical formula 1, and an example of the crosslinkage caused when the resist material includes a cross linking agent is represented by the following chemical formula 2:

[Chemical formula 1]

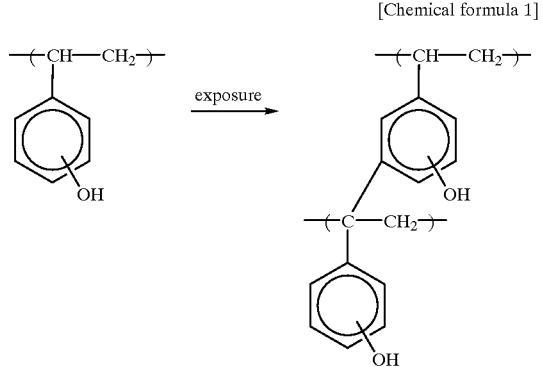

[Chemical formula 2]

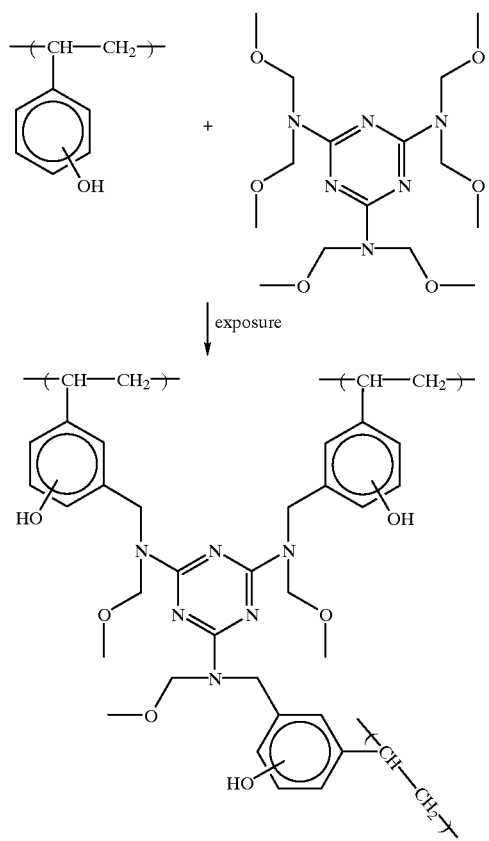

The aforementioned resist material SAL-601 manufactured by Shipley Far East Company includes a cross linking agent.

Next, the semiconductor substrate 1 is heated to a temperature of approximately 110° C., and a vapor treatment for supplying dimethylsilyl dimethylamine (DMSDMA) 5 having been put in a gas phase through bubbling as a silylation agent onto the surface of the resist film 2 for approximately 90 seconds is conducted as is shown in FIG. 7(c). Through this vapor treatment, silylation between OH groups of a resin included in the resist film 2 and silyl groups of the DMSDMA 5 is caused in an unexposed portion 2b of the resist film 2 as is represented by the following chemical formula 3, thereby forming a silylated layer 6 on the surface. On the other hand, in the exposed portion 2a of the resist film 2, the silylated layer 6 is not formed because the molecular weight of the resin included in the resist material has been so increased through the crosslinkage that the silylation between the OH groups and the silyl groups is scarcely caused. In this case, a by-product generated through the silylation is evaporated. In the following chemical formula 3, R indicates the resin included in the resist material:

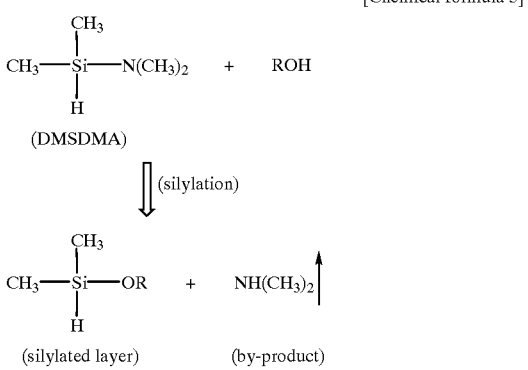

[Chemical formula 3]

(DMSDMA)

(silylation)

(silylated layer)    (by-product)

Next, the exposed portion 2a of the resist film 2 is removed through dry etching of the resist film 2 by using the silylated layer 6 as a mask as is shown in FIG. 7(d). Thus, a resist pattern 7 is formed in the unexposed portion 2b of the resist film 2.

Since this pattern formation method using the silylation process adopts the dry etching conducted by using the silylated layer formed on the surface of the resist film as a mask, the method is not affected by reflected light from the semiconductor substrate. Therefore, the resultant resist pattern can attain a high aspect ratio.

However, according to this method, the pattern width of the silylated layer 6 is smaller than the width of the unexposed portion 2b of the resist film 2 as is shown in FIG. 7(c). In addition, the thickness of the silylated layer 6 is not sufficiently large and is further smaller toward the edges of the pattern. Accordingly, when the etching is conducted on the resist film 2 by using this silylated layer 6 as a mask, the edges of the pattern of the silylated layer 6 are damaged through the etching as is shown in FIG. 7(d). Thus, this method has a problem that the pattern width of the resist pattern 7 becomes further smaller than the width of the unexposed portion 2b of the resist film 2.

This problem also occurs when a resist pattern is formed as follows: A silylation agent is supplied onto the surface of a resist film having been subjected to the pattern exposure, so as to form a silylated layer on the surface of an exposed portion of the resist film exposed through the pattern exposure. Then, the resist film is etched by using the silylated layer as a mask, thereby removing an unexposed portion of the resist film.

When the pattern width of the silylated layer is small and thin as described above, the silylated layer cannot sufficiently exhibit a masking function, resulting in degrading the pattern shape of the resultant resist pattern. As a result, a failure can be caused in the semiconductor device in subsequent processes. Thus, the yield of the semiconductor device can be disadvantageously decreased.

SUMMARY OF THE INVENTION

In view of the aforementioned problems, the object of the invention is preventing the degradation in the pattern shape of a resist pattern by making the pattern width of a silylated layer formed on a resist film substantially the same as the width of an exposed or unexposed portion of the resist film and increasing the thickness of the silylated layer.

The present inventors made various examinations and found that the degradation in the pattern shape of a resist pattern is caused because the silylation between OH groups (weak acidic groups) of the resist film and silyl groups of a silylation agent occurring on the surface of the resist film in response to the supply of the silylation agent is inhibited by an alkali component generated from the silylation agent.

The following chemical formula 4 represents a reaction between $N(CH_3)_2$ groups (alkali component) of DMSDMA and OH groups of the resist film. Since the reaction of the chemical formula 4 occurs in parallel with (competitively with) the silylation represented by the chemical formula 3, the number of OH groups concerned in the silylation is decreased, resulting in inhibiting the silylation. In the following chemical formula 4, R indicates a resin included in the resist:

[Chemical formula 4]

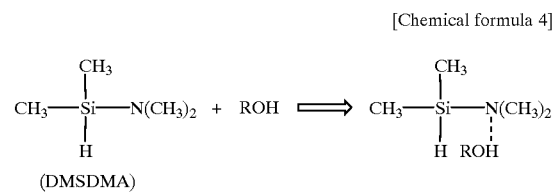

(DMSDMA)

Also, the following chemical formula 5 represents a reaction between an alkaline by-product generated through the silylation represented by the chemical formula 3 and the OH groups of the resist film. Owing to the reaction of the chemical formula 5, the number of the OH groups concerned in the silylation is also decreased, resulting in inhibiting the silylation. In the following chemical formula 5, R indicates a resin included in the resist:

[Chemical formula 5]

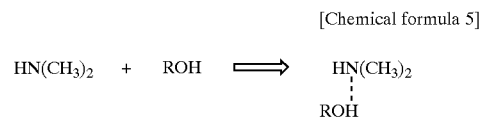

The present invention was devised on the basis of this finding that the width and the thickness of the silylated layer is decreased because the silylation cannot be sufficiently caused due to the decreased number of the OH groups concerned in the silylation through the reaction between the alkali component included in the silylation agent and the OH groups. According to the invention, a silylation agent which does not produce an alkali component is supplied onto the surface of a resist film having been subjected to the pattern exposure, so as to form a silylated layer in a portion of the resist film where crosslinkage is not caused.

The first pattern formation method of this invention comprises a first step of forming a resist film by coating a semiconductor substrate with a resist; a second step of conducting pattern exposure on the resist film by using a mask having a desired pattern shape; a third step of forming a silylated layer in an unexposed portion of the resist film not exposed in the pattern exposure by supplying a silylation agent including a silane compound represented by the following general formula (1) onto a surface of the resist film having been subjected to the pattern exposure:

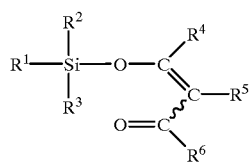

(1)

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms), a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and a fourth step of forming a resist pattern out of the resist film by removing an exposed portion of the resist film exposed in the pattern exposure through etching of the resist film by using the silylated layer as a mask.

In the first pattern formation method, the silylated layer is formed in the unexposed portion of the resist film by supplying the silylation agent including the silane compound represented by the general formula (1) onto the surface of the resist film having been subjected to the pattern exposure. Therefore, no alkali component is generated through the silylation for forming the silylated layer, and a by-product generated through the silylation is not alkaline. Accordingly, most of the OH groups present in the unexposed portion of the resist film are concerned in the silylation. As a result, the silylated layer having a width substantially the same as the width of the unexposed portion and a large thickness can be formed in the unexposed portion. When the thus obtained silylated layer is used as a mask in conducting the dry etching on the resist film, the pattern shape of the resultant resist pattern can be free from the degradation and a desired pattern width can be attained.

The second pattern formation method of this invention comprises a first step of forming a resist film by coating a semiconductor substrate with a resist; a second step of conducting pattern exposure on the resist film by using a mask having a desired pattern shape; a third step of forming a silylated layer in an unexposed portion of the resist film not exposed in the pattern exposure by supplying a silylation agent including a silane compound represented by the following general formula (2) onto a surface of the resist film having been subjected to the pattern exposure:

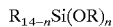
(2)

wherein n indicates an integer ranging between 1 and 3; R indicates a substituted or non-substituted saturated hydrocarbon group having 1 through 6 carbon atoms, a substituted or non-substituted unsaturated hydrocarbon group having 1 through 6 carbon atoms or a substituted or non-substituted alkylcarbonyl group having 1 through 6 carbon atoms; and $R^1$ is one group or a combination of two or more groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms and an alicyclic saturated hydrocarbon group having 3 through 6 carbon atoms; and a fourth step of forming a resist pattern out of the resist film by removing an exposed portion of the resist film exposed in the pattern exposure through etching of the resist film by using the silylated layer as a mask.

In the second pattern formation method, the silylated layer is formed in the unexposed portion of the resist film by supplying the silylation agent including the silane compound represented by the general formula (2) onto the surface of the resist film having been subjected to the pattern exposure. Therefore, no alkali component is generated through the silylation for forming the silylated layer, and a by-product generated through the silylation is not alkaline. Accordingly, most of the OH groups present in the unexposed portion of the resist film are concerned in the silylation. As a result, the silylated layer having a width substantially the same as the width of the unexposed portion and a large thickness can be formed in the unexposed portion. When the thus obtained silylated layer is used as a mask in conducting the dry etching on the resist film, the pattern shape of the resultant resist pattern can be free from the degradation and a desired pattern width can be attained.

The third pattern formation method of this invention comprises a first step of forming a resist film by coating a semiconductor substrate with a resist; a second step of conducting pattern exposure on the resist film by using a mask having a desired pattern shape; a third step of forming a silylated layer in an exposed portion of the resist film exposed in the pattern exposure by supplying a silylation agent including a silane compound represented by the following general formula (1) onto a surface of the resist film having been subjected to the pattern exposure:

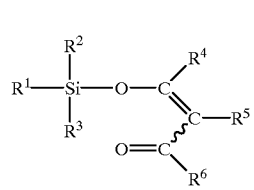

(1)

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group-having 3 through 6 carbon atoms; and $R^4$, $R^5$ and $R^6$ are the same or different groups selected from the group consisting of a hydrogen atom, $OR^7$ wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms), a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and a fourth step of forming a resist pattern out of the resist film by removing an unexposed portion of the resist film not exposed in the pattern exposure through etching of the resist film by using the silylated layer as a mask.

In the third pattern formation method, the silylated layer is formed in the exposed portion of the resist film by supplying the silylation agent including the silane compound represented by the general formula (1) onto the surface of the resist film having been subjected to the pattern exposure. Therefore, no alkali component is generated through the silylation for forming the silylated layer, and a by-product generated through the silylation is not alkaline. Accordingly, most of the OH groups present in the exposed portion of the resist film are concerned in the silylation. As a result, the silylated layer having a width substantially the same as the width of the exposed portion and a large thickness can be formed in the exposed portion. When the thus obtained silylated layer is used as a mask in conducting the dry etching on the resist film, the pattern shape of the resultant resist pattern can be free from the degradation and a desired pattern width can be attained.

The fourth pattern formation method of this invention comprises a first step of forming a resist film by coating a semiconductor substrate with a resist; a second step of conducting pattern exposure on the resist film by using a mask having a desired pattern shape; a third step of forming a silylated layer in an exposed portion of the resist film exposed in the pattern exposure by supplying a silylation agent including a silane compound represented by the following general formula (2) onto a surface of the resist film having been subjected to the pattern exposure:

$$R^1{}_{4-n}Si(OR)_n \qquad (2)$$

wherein n indicates an integer ranging between 1 and 3; R indicates a substituted or non-substituted saturated hydrocarbon group having 1 through 6 carbon atoms, a substituted or non-substituted unsaturated hydrocarbon group having 1 through 6 carbon atoms or a substituted or non-substituted alkylcarbonyl group having 1 through 6 carbon atoms; and $R^1$ is one group or a combination of two or more groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms and an alicyclic saturated hydrocarbon group having 3 through 6 carbon atoms; and a fourth step of forming a resist pattern out of the resist film by removing an unexposed portion of the resist film not exposed in the pattern exposure through etching of the resist film by using the silylated layer as a mask.

In the fourth pattern formation method, the silylated layer is formed in the exposed portion of the resist film by supplying the silylation agent including the silane compound represented by the general formula (2) onto the surface of the resist film having been subjected to the pattern exposure. Therefore, no alkali component is generated through the silylation for forming the silylated layer, and a by-product generated through the silylation is not alkaline. Accordingly, most of the OH groups present in the exposed portion of the resist film are concerned in the silylation. As a result, the silylated layer having a width substantially the same as the width of the exposed portion and a large thickness can be formed in the exposed portion. When the thus obtained silylated layer is used as a mask in conducting the dry etching on the resist film, the pattern shape of the resultant resist pattern can be free from the degradation and a desired pattern width can be attained.

In the first or second pattern formation method, when a chemically amplified resist including an acid generator, an alkali-soluble resin and a compound or resin that is crosslinked by a function of an acid is used as the resist, it is possible to obtain a resist pattern of the chemically amplified resist free from the degradation of the pattern shape.

In the third or fourth pattern formation method, when a chemically amplified resist including an acid generator and a resin that is changed to be alkali-soluble by a function of an acid is used as the resist used in the first step, it is possible to obtain a resist pattern of the chemically amplified resist free from the degradation of the pattern shape.

In the third or fourth pattern formation method, when a chemically amplified resist including an acid generator, an alkali-soluble resin and a compound or resin that is changed to be alkali-soluble by a function of an acid is used as the resist, it is possible to obtain a resist pattern of the chemically amplified resist free from the degradation of the pattern shape.

In the third or fourth pattern formation method, when a general resist including a naphthoquinone diazido compound and a novolak resin is used as the resist, it is possible to obtain a resist pattern of the general resist free from the degradation of the pattern shape.

DETAILED DESCRIPTION OF THE INVENTION

EMBODIMENT 1

A pattern formation method according to a first embodiment of the invention will now be described with reference to FIGS. 1(a) through 1(d).

Figure 1A:
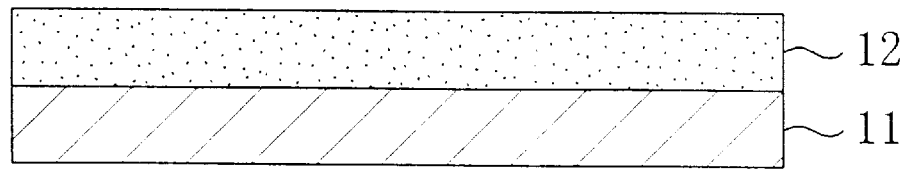
FIGS. 1(a) through 1(d) are sectional views for showing procedures in a pattern formation method according to a first embodiment of the invention.
Figure 1B:
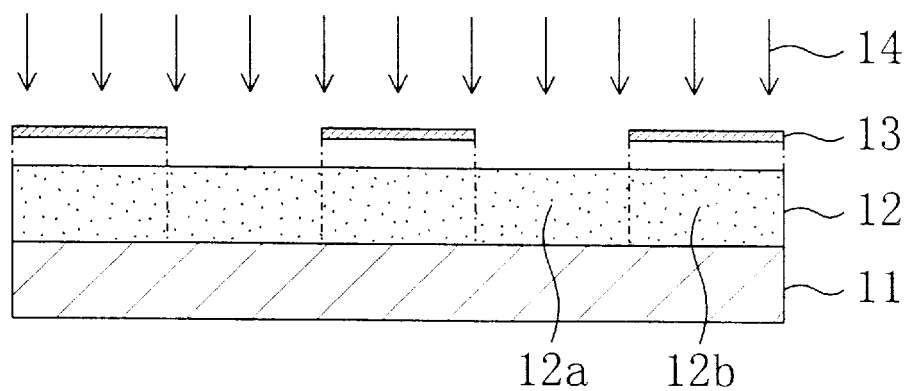

First, a resist film 12 with a thickness of 0.7 μm is formed by coating a semiconductor substrate 11 with a resist (such as SAL-601; manufactured by Shipley Far East Company) as is shown in FIG. 1(a). Then, as is shown in FIG. 1(b), pattern exposure is conducted by irradiating the resist film 12 with ArF excimer laser 14 with an ArF excimer exposure machine (having NA of 0.55) by using a mask 13 having a desired pattern shape.

In an exposed portion 12a of the resist film 12 exposed in the pattern exposure, crosslinkage is caused as is represented by the aforementioned chemical formula 2.

Figure 1C:
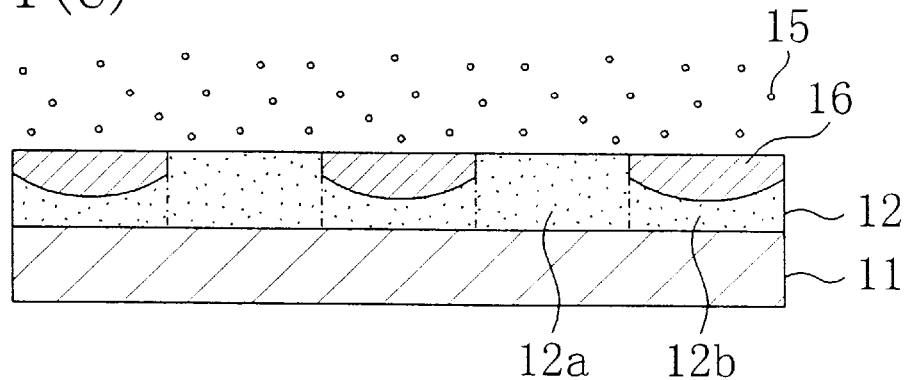

Next, the semiconductor substrate 11 is heated to a temperature of approximately 100° C., and a silylation agent 15 of 4-dimethylsiloxy-3-penten-2-one which has been put in a gas phase through bubbling with a nitrogen gas is supplied onto the surface of the resist film 12 for approximately 90 seconds as is shown in FIG. 1(c).

In this manner, in an unexposed portion 12b of the resist film 12, silylation between OH groups of the resist film 12 and dimethylsilyl groups of 4-dimethylsiloxy-3-penten-2-one is caused as is represented by the following chemical formula 6, resulting in forming a silylated layer 16 with a large width and a large thickness. On the other hand, in the exposed portion 12a of the resist film 12, the silylated layer 6 is not formed because the molecular weight of a resin included in the resist has been so increased through the crosslinkage that the silylation between the OH groups and the silyl groups is scarcely caused. In the following chemical formula 6, R indicates the resin included in the resist:

[Chemical formula 6]

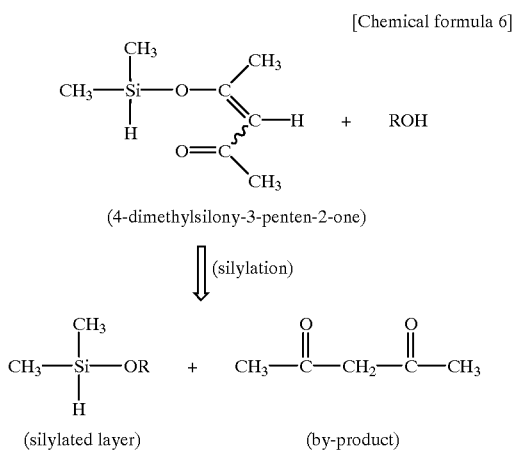

(4-dimethylsilony-3-penten-2-one)

(silylation)

(silylated layer)  (by-product)

As is shown in the chemical formula 6, H in the OH groups present in the unexposed portion 12b of the resist film 12 is substituted with Si(CH$_3$)$_2$ (a dimethylsilyl group) with CH$_3$COCH$_2$COCH$_3$ (acetylacetone) generated as a by-product.

Figure 1D:
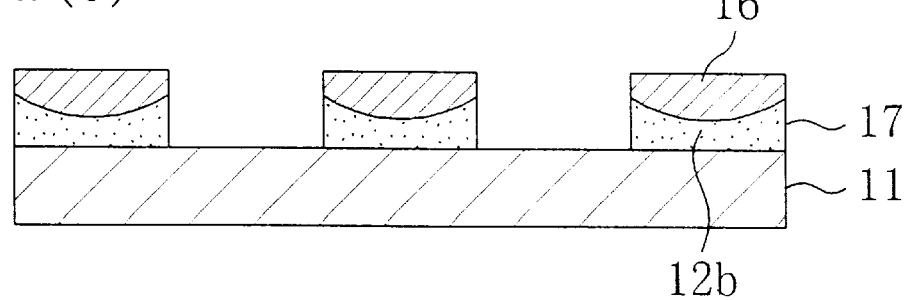

Next, by using the silylated layer 16 as a mask, dry etching is conducted on the resist film 12 with a dry developer (such as TCP9400; manufactured by LAM research). Thus, the exposed portion 12a of the resist film 12 is removed as is shown in FIG. 1(d), thereby forming a positive resist pattern 17 in the unexposed portion 12b of the resist film 12.

In the first embodiment, since 4-dimethylsiloxy-3-penten-2-one is used as the silylation agent, no alkali component is generated through the silylation, and the by-product is not alkaline. Therefore, most of the OH groups present in the unexposed portion 12b of the resist film 12 where the crosslinkage is not caused are concerned in the silylation. As a result, the silylated layer 16 with a large width and a large thickness can be formed in the unexposed portion 12b as is shown in FIG. 1(c). Accordingly, when the resist film 12 is dry etched by using this silylated layer 16 as a mask, the resist pattern 17 can be free from the degradation in the pattern shape and attain a desired pattern width (0.20 μm) and a rectangular section as is shown in FIG. 1(d).

The first embodiment is widely applicable to resists in which crosslinkage can be caused in an exposed portion through the pattern exposure. It is noted that the irradiation with the ArF excimer laser can cause the crosslinkage in an exposed portion of any of resist materials including a cross linking agent and those not including a cross linking agent. In contrast, irradiation with KrF excimer laser causes the crosslinkage in a resist material including a cross linking agent but does not cause the crosslinkage in some of resist materials not including a cross linking agent. The above-described SAL-601 manufactured by Shipley Far East Company is a resist material including a cross linking agent.

MODIFICATION OF EMBODIMENT 1

In the first embodiment, the pattern exposure is conducted by irradiating the resist film 12 with the ArF excimer laser 14 through the mask 13 having a desired pattern shape. Instead, the pattern exposure can be conducted on the resist film 12 without using the mask 13. This method will now be described with reference to FIGS. 2(a) through 2(d).

Figure 2A:
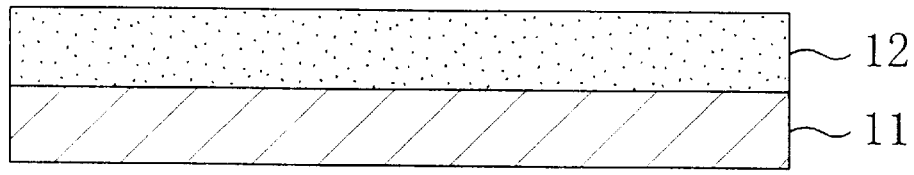
FIGS. 2(a) through 2(d) are sectional views for showing procedures in a pattern formation method according to a modification of the first embodiment.
Figure 2B:
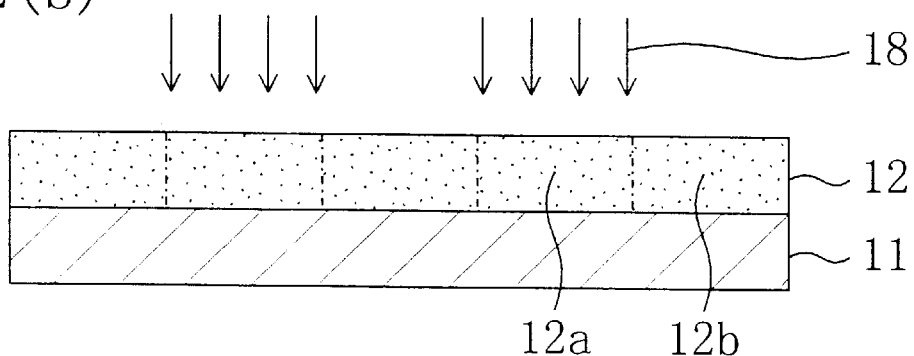

First, a resist film 12 is formed by coating a semiconductor substrate 11 with a similar resist to that used in the first embodiment as is shown in FIG. 2(a). Then, as is shown in FIG. 2(b), the resist film 12 is exposed to electron beams 18 in a desired pattern shape in vacuum (1×10$^{-7}$ Torr). Instead of the pattern exposure using the electron beams 18, the pattern exposure can be conducted by using extreme UV light (light with a wavelength of a 13 nm band or light with a wavelength of a 5 nm band), ion beams or the like in vacuum (for example, 1×10$^{-6}$ through 1×10$^{-8}$ Torr). In this manner, the crosslinkage is caused in an exposed portion 12a of the resist pattern 12 exposed in the pattern exposure.

Figure 2C:
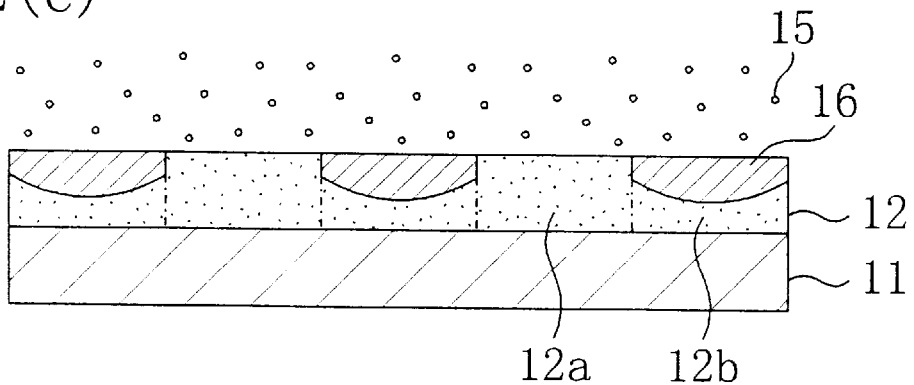

Next, the semiconductor substrate 11 is heated to a temperature of approximately 100° C., and a silylation agent 15 in a gas phase is supplied onto the surface of the resist film 12 as is shown in FIG. 2(c). In this manner, a silylated layer 16 with a large width and a large thickness is formed through the silylation in an unexposed portion 12b of the resist film 12, and the silylated layer 16 is not formed in the exposed portion 12a of the resist film 12 where the silylation is scarcely caused.

Figure 2D:
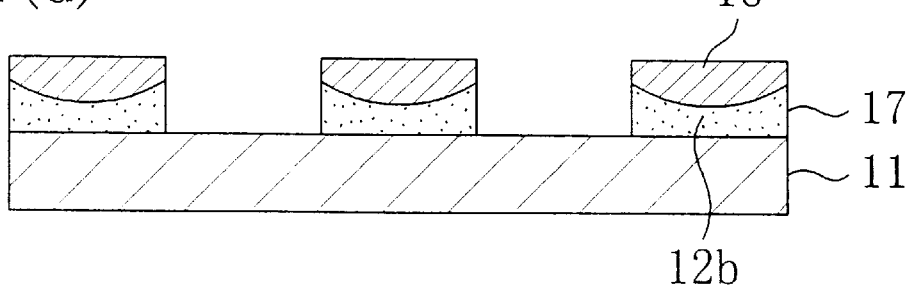

Then, the resist film 12 is dry etched by using the silylated layer 16 as a mask, thereby removing the exposed portion 12a of the resist film 12 as is shown in FIG. 2(d). As a result, a positive resist pattern 17 is formed in the unexposed portion 12b of the resist film 12.

EMBODIMENT 2

A pattern formation method according to a second embodiment of the invention will now be described with reference to FIGS. 3(a) through 3(c), 4(a) and 4(b).

Figure 3A:
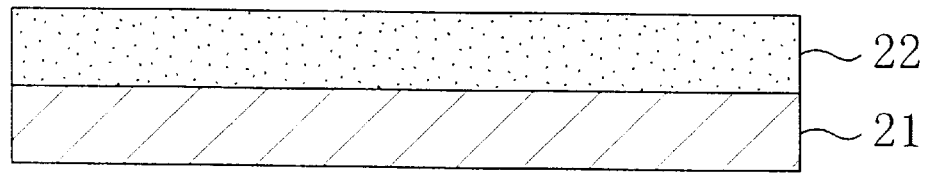
FIGS. 3(a) through 3(c) are sectional views for showing procedures in a pattern formation method according to a second embodiment of the invention.
Figure 3B:
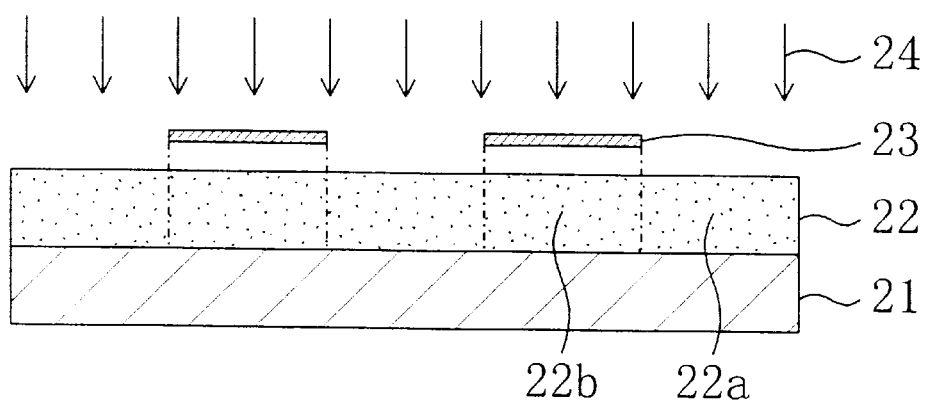

First, a resist film 22 with a thickness of 0.7 μm is formed by coating a semiconductor substrate 21 with a resist (such as PLASMASK305U; manufactured by UCB) as is shown in FIG. 3(a). Then, as is shown in FIG. 3(b), the pattern exposure is conducted by irradiating the resist film 22 with KrF excimer laser 24 with a KrF excimer exposure machine (having NA of 0.55) by using a mask 23 having a desired pattern shape.

Figure 3C:
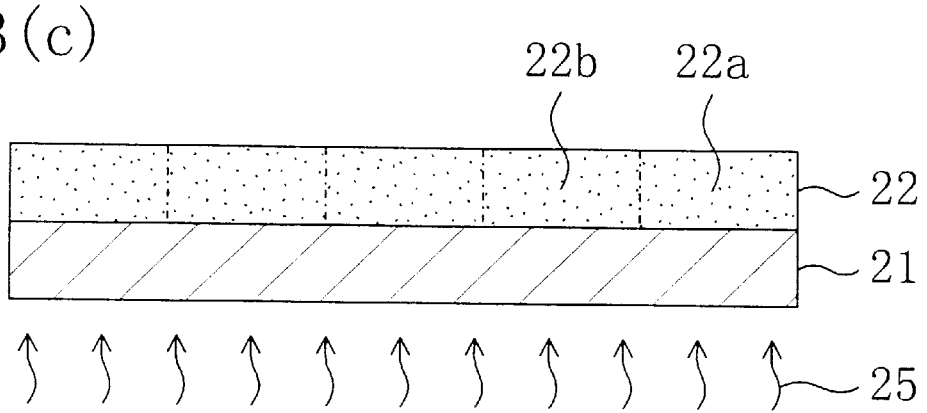

Next, the semiconductor substrate 21 is subjected to baking 25 for 120 seconds at a temperature of 175° C. as is shown in FIG. 3(c).

In this manner, crosslinkage is caused by the heat in an unexposed portion 22b of the resist film 22, and in an exposed portion 22a of the resist film 22, the crosslinkage due to the heat is scarcely caused because a naphthoquinone diazido compound included in the resist is decomposed to generate carboxylic acid.

Figure 4A:
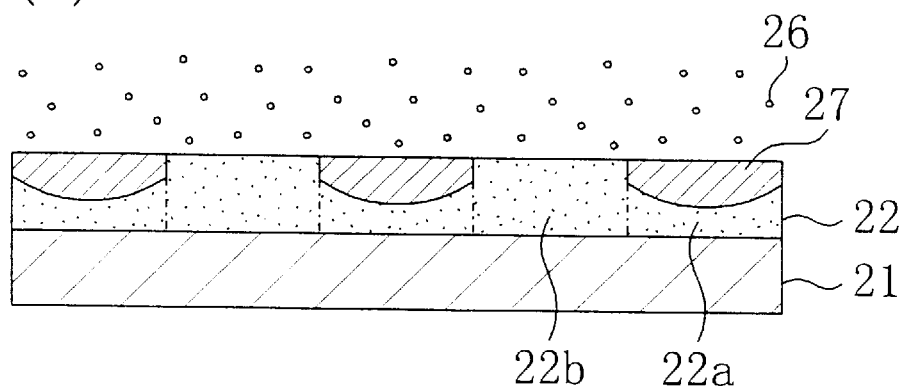
FIGS. 4(a) and 4(b) are sectional views for showing other procedures in the pattern formation method of the second embodiment.

Then, the semiconductor substrate 21 is heated to a temperature of approximately 100° C., and a silylation agent 26 of 4-dimethylsiloxy-3-penten-2-one which has been put in a gas phase through bubbling with a nitrogen gas is supplied onto the surface of the resist film 22 for 90 seconds as is shown in FIG. 4(a). In this manner, in the exposed portion 22a of the resist film 22, the silylation between OH groups of the resist film 22 and dimethylsilyl groups of 4-dimethylsiloxy-3-penten-2-one is caused as is represented by the aforementioned chemical formula 6, resulting in forming a silylated layer 27 with a large width and a large thickness. On the other hand, in the unexposed portion 22b of the resist film 22, the silylated layer 27 is not formed because the molecular weight of a resin included in the resist has been so increased through the crosslinkage that the silylation between the OH groups and the silyl groups is scarcely caused.

Figure 4B:
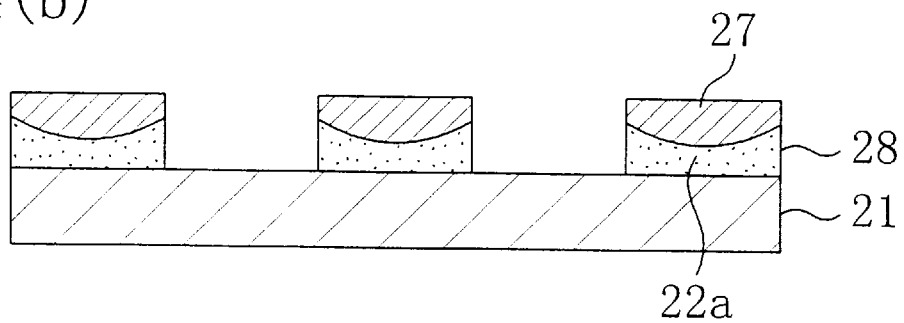

Next, the resist film 22 is dry etched by using the silylated layer 27 as a mask with a dry developer (for example, TCP9400; manufactured by LAM research), thereby removing the unexposed portion 22b of the resist film 22 as is shown in FIG. 4(b). As a result, a negative resist pattern 28 is formed in the exposed portion 22a of the resist film 22.

In the second embodiment, since 4-dimethylsiloxy-3-penten-2-one is used as the silylation agent, no alkali component is generated through the silylation, and the by-product is not alkaline. Therefore, most of OH groups present in the exposed portion 22a of the resist film 22 where the crosslinkage is scarcely caused are concerned in the silylation, and hence, the silylated layer 27 with a large width and a large thickness can be formed in the exposed portion 22a as is shown in FIG. 4(a). Accordingly, when the resist film 22 is dry etched by using this silylated layer 27 as a mask, the resist pattern 28 can be free from the degradation in the pattern shape and attain a desired pattern width (0.20 μm) and a rectangular section as is shown in FIG. 4(b).

In the second embodiment, any resist in which the crosslinkage can be caused by heat without the pattern exposure, such as a resist including a naphthoquinone diazido compound and a novolak resin, can be used. When such a resist is used, the naphthoquinone diazido compound is decomposed to generate carboxylic acid in the exposed portion, and the decomposition of the naphthoquinone diazido compound is regarded to improve the reactivity of OH groups of the novolak resin in the silylation.

MODIFICATION OF EMBODIMENT 2

In the second embodiment, the pattern exposure is conducted by irradiating the resist film 22 with the ArF excimer laser 24 by using the mask 23 having a desired pattern shape. Instead, the pattern exposure can be conducted on the resist film 22 without using the mask 23. This method will now be described with reference to FIGS. 5(a) through 5(c), 6(a) and 6(b).

Figure 5A:
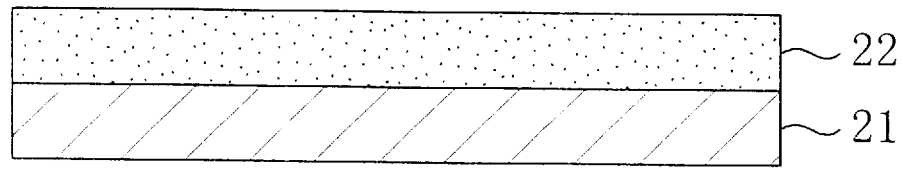
FIGS. 5(a) through 5(c) are sectional views for showing procedures in a pattern formation method according to a modification of the second embodiment.
Figure 5B:
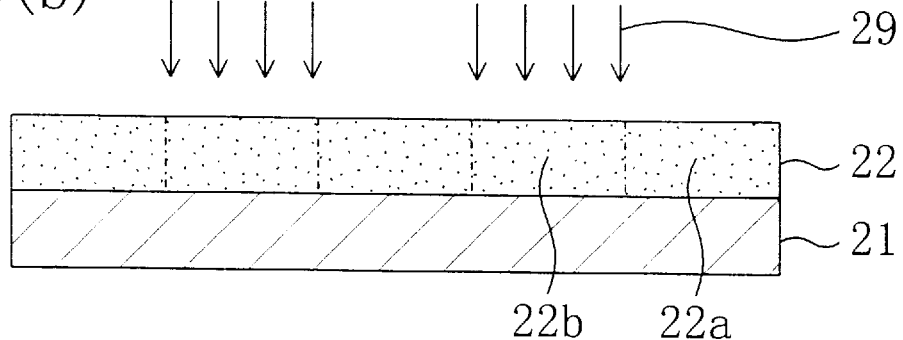

First, a resist film 22 is formed by coating a semiconductor substrate 21 with a similar resist to that used in the second embodiment as is shown in FIG. 5(a). Then, the resist film 22 is exposed to electron beams 29 in a desired pattern shape in vacuum ($1 \times 10^{-7}$ Torr) as is shown in FIG. 5(b). Instead of the pattern exposure using the electron beams 29, the pattern exposure can be conducted by using extreme UV light (light with a wavelength of a 13 nm band or light with a wavelength of a 5 nm band), ion beams or the like in vacuum (for example, $1 \times 10^{-6}$ through $1 \times 10^{-8}$ Torr).

Figure 5C:
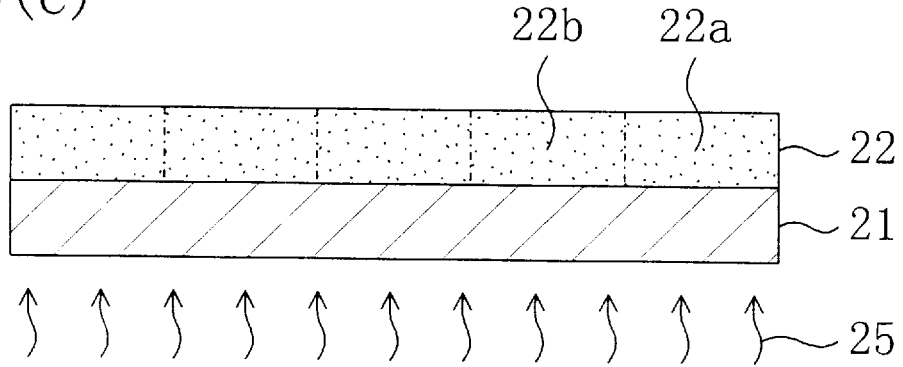

Next, as is shown in FIG. 5(c), the semiconductor substrate 21 is subjected to baking 25 for 120 seconds at a temperature of 175° C. In this manner, in an unexposed portion 22b of the resist film 22, the crosslinkage is caused by the heat, and in an exposed portion 22a of the resist film 22, the crosslinkage is scarcely caused by the heat.

Figure 6A:
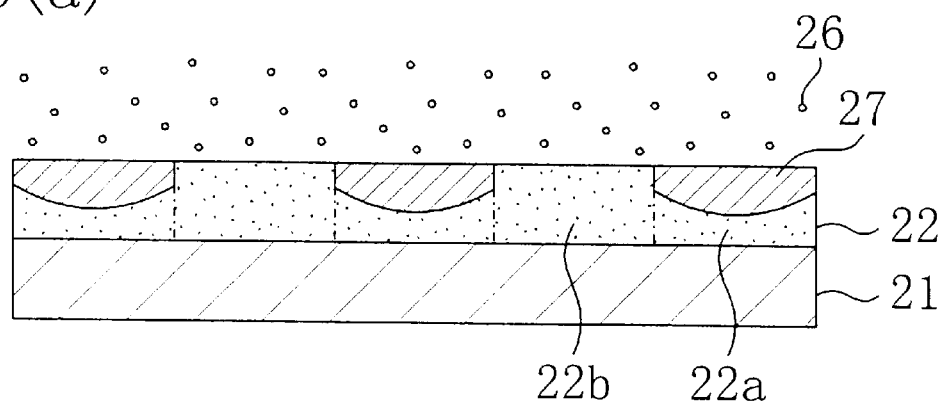
FIGS. 6(a) and 6(b) are sectional views for showing other procedures in the pattern formation method according to the modification of the second embodiment.

Then, the semiconductor substrate 21 is heated to a temperature of approximately 100° C., and a silylation agent 26 in a gas phase is supplied onto the surface of the resist film 22 as is shown in FIG. 6(a). In this manner, in the exposed portion 22a of the resist film 22, the silylation is caused so as to form a silylated layer 27 with a large width and a large thickness, and in the unexposed portion 22b of the resist film 22, the silylated layer 27 is not formed because the silylation is scarcely caused.

Figure 6B:
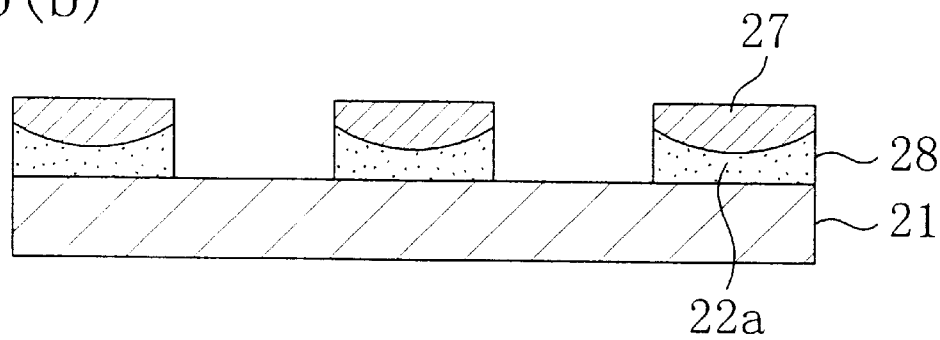
Figure 7A:
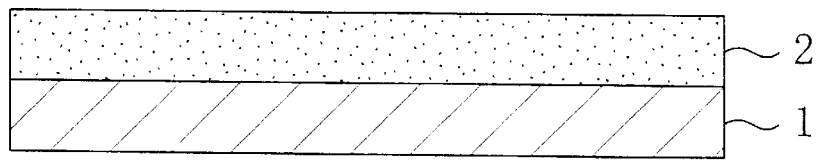
FIGS. 7(a) through 7(d) are sectional views for showing procedures in a conventional pattern formation method.
Figure 7B:
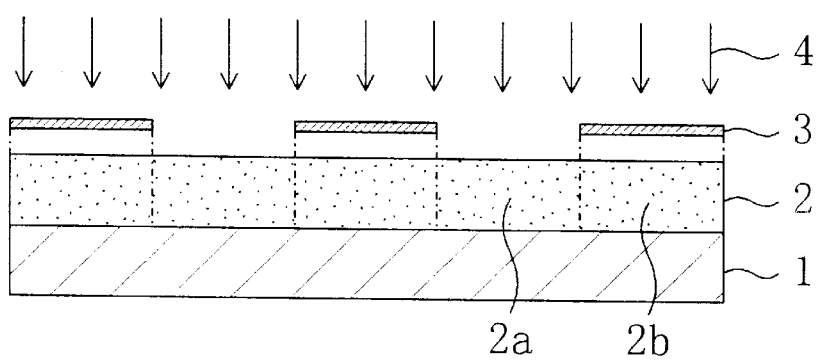
Figure 7C:
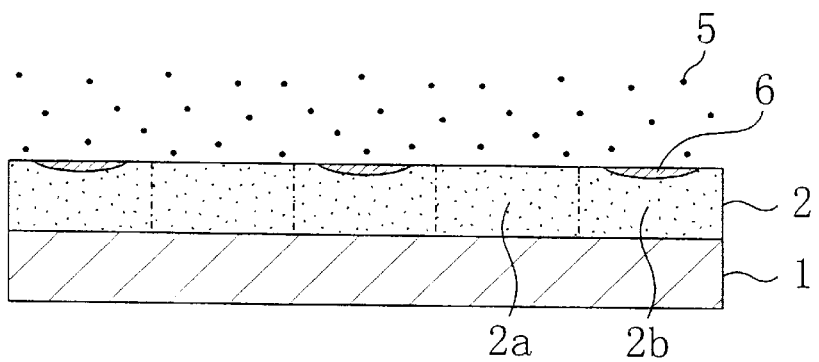
Figure 7D:
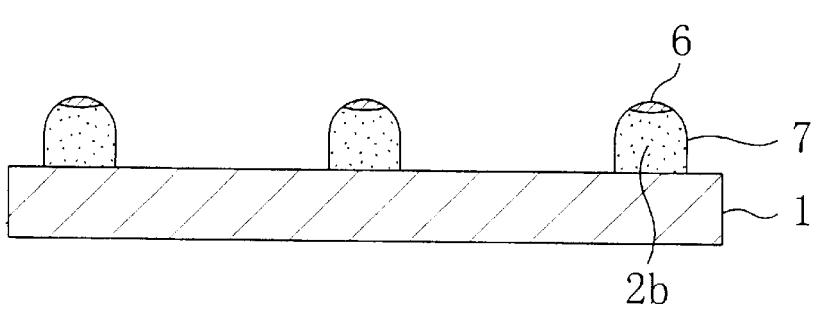

Next, the resist film 22 is dry etched by using the silylated layer 27 as a mask, thereby removing the unexposed portion 22b of the resist film 22 as is shown in FIG. 6(b). As a result, a negative resist pattern 28 is formed in the exposed portion 22a of the resist film 22.

In the first and second embodiments, 4-dimethylsiloxy-3-penten-2-one is used as the silylation agent, but the silylation agent is not limited to this. Specifically, any silylation agent including a silane compound represented by the following general formula (1) can be used:

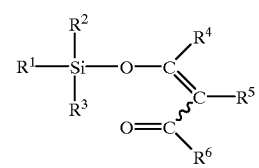

(1)

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms), a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms.

First examples of the silane compound represented by the general formula (1) include:

[Chemical formula 7]

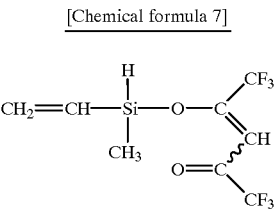

(a)

-continued (b) 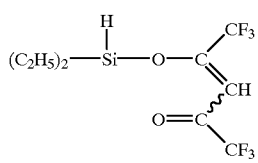

(c) 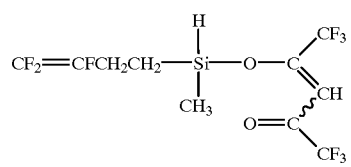

(d) 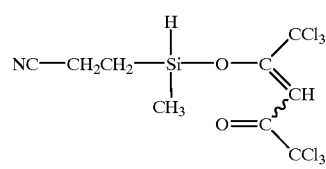

[Chemical formula 8]

(e) 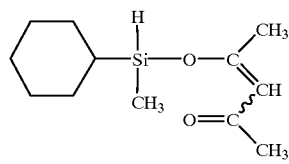

(f) 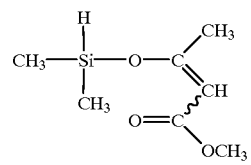

(g) 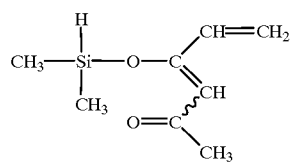

(h) 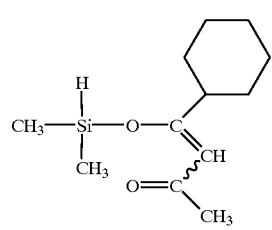

[Chemical formula 9]

(i) 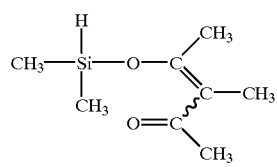

-continued (j) 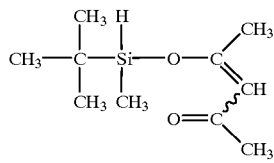

(k) 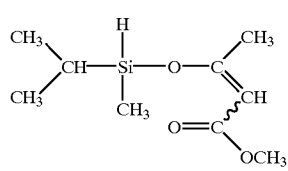

In the chemical formulas 7 through 9, (a) indicates 3-methylvinylsiloxytrifluoromethyl-2-propen-1-trifluoromethyl-1-one; (b) indicates 3-diethylsiloxytrifluoromethyl-2-propen-1-trifluoromethyl-1-one; (c) indicates 3-methyl(3',4',4'-trifluoro-3'-butenyl)siloxytrifluoromethyl-2-propen-1-trifluoromethyl-1-one; (d) indicates 3-methyl(2'-cyanoethyl)siloxytrichloromethyl-2-propen-1-trichloromethyl-1-one; (e) indicates 4-methylcyclohexylsiloxy-3-penten-2-one; (f) indicates 2-dimethylsiloxy-1-methoxycarbonyl-1-propene; (g) indicates 4-dimethylsiloxy-3,5-hexadien-2-one; (h) indicates 4-dimethylsiloxy-4-cyclohexyl-3-buten-2-one; (i) indicates 4-dimethylsiloxy-3-methyl-3-penten-2-one; (j) indicates 4-t-butylmethylsiloxy-3-penten-2-one; and (k) indicates 2-isopropylmethylsiloxy-1-methoxycarbonyl-1-propene.

Second examples of the silane compound represented by the general formula (1) include:

[Chemical formula 10]

(l) 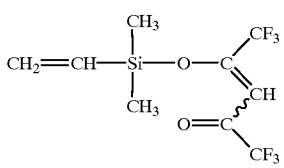

(m) 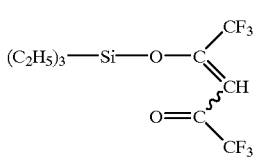

(n) 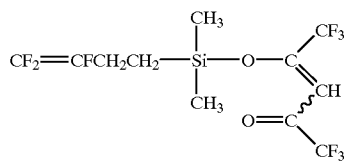

(o) 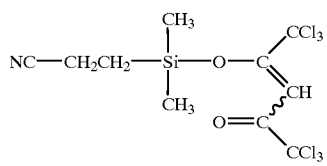

[Chemical formula 11]

(p) 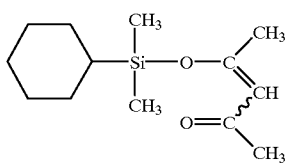

(q) 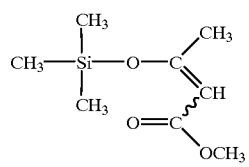

(r) 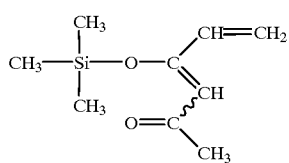

(s) 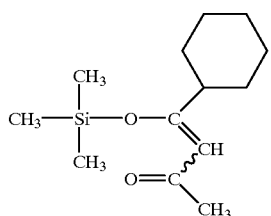

[Chemical formula 12]

(t) 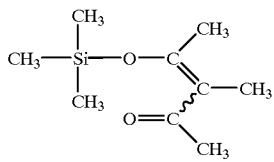

(u) 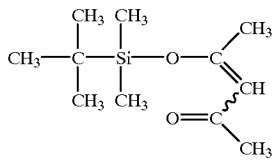

(v) 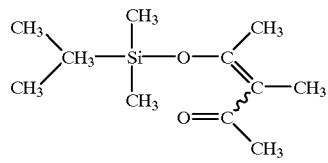

In the chemical formulas 10 through 12, (1) indicates 3-dimethylvinylsiloxytrifluoromethyl-2-propen-1-trifluoromethyl-1-one; (m) indicates 3-triethylsiloxytrifluoromethyl-2-propen-1-trifluoromethyl-1-one; (n) indicates 3-dimethyl(3',4',4'-trifluoro-3'-butenyl)siloxytrifluoromethyl-2-propen-1-trifluoromethyl-1-one; (o) indicates 3-dimethyl(2'-cyanoethyl)siloxytrichloromethyl-2-propen-1-trichloromethyl-1-one; (p) indicates 4-dimethylcyclohexylsiloxy-3-penten-2-one; (q) indicates 2-trimethylsiloxy-1-methoxycarbonyl-1-propene; (r) indicates 4-trimethylsiloxy-3,5-hexadien-2-one; (s) indicates 4-trimethylsiloxy-4-cyclohexyl-3-buten-2-one; (t) indicates 4-trimethylsiloxy-3-methyl-3-penten-2-one; (u) indicates 4-t-butyldimethylsiloxy-3-penten-2-one; and (v) indicates 2-isopropyldimethylsiloxy-1-methoxycarbonyl-1-propene.

Furthermore, as the silylation agent used in the first and second embodiments, any silylation agent including a silane compound represented by the following general formula (2) can be used:

$$R^1_{4-n}Si(OR)_n \qquad (2)$$

wherein n indicates an integer ranging between 1 and 3; R indicates a substituted or non-substituted saturated hydrocarbon group having 1 through 6 carbon atoms, a substituted or non-substituted unsaturated hydrocarbon group having 1 through 6 carbon atoms or a substituted or non-substituted alkylcarbonyl group having 1 through 6 carbon atoms; and $R^1$ is one group or a combination of two or more groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms and an alicyclic saturated hydrocarbon group having 3 through 6 carbon atoms.

Specific examples of the silane compound represented by the general formula (2) include compounds represented by the following chemical formulas 13 through 23:

[Chemical formula 13]

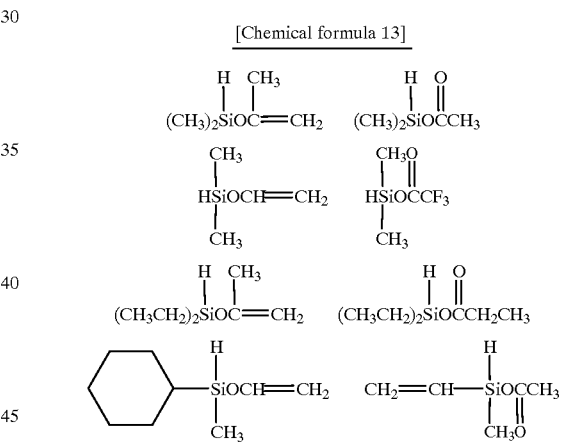

[Chemical formula 14]

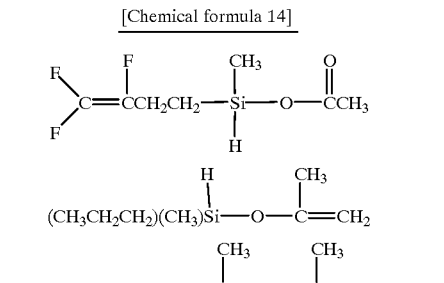

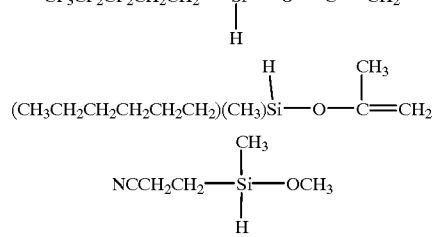

-continued
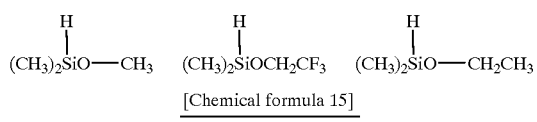
[Chemical formula 15]
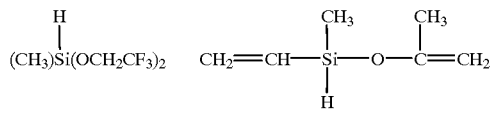
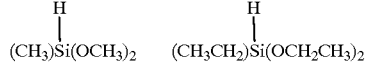
[Chemical formula 16]
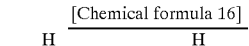
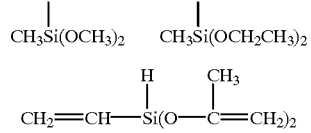
[Chemical formula 17]
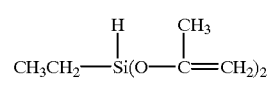
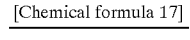
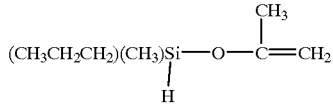
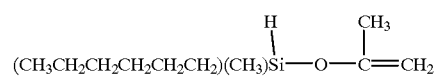
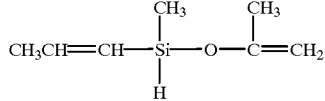
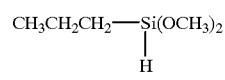
[Chemical formula 18]
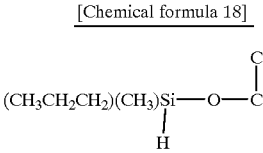
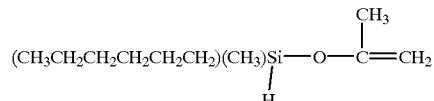
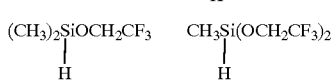
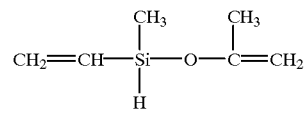
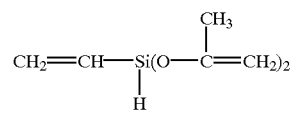
-continued
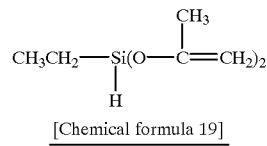
[Chemical formula 19]
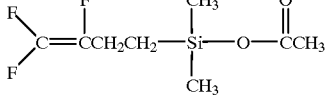
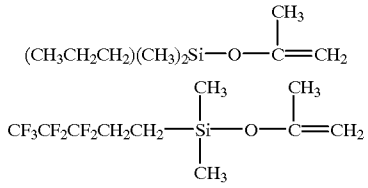
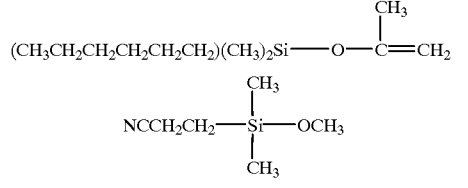
[Chemical formula 20]
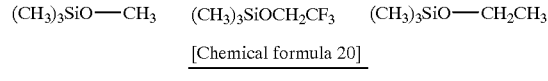
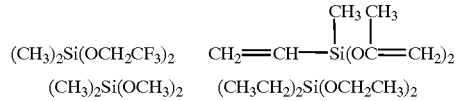
[Chemical formula 21]
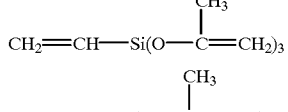
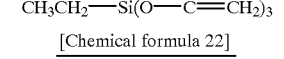
[Chemical formula 22]
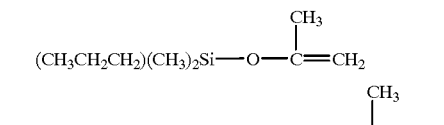
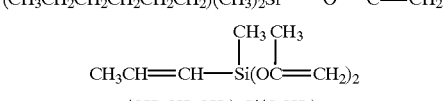
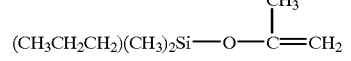
[Chemical formula 23]
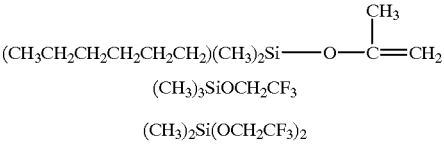

-continued $$CH_2=CH-Si(OC=CH_2)_2 \overset{CH_3\ CH_3}{\underset{|\ \ \ \ |}{}}$$

$$CH_2=CH-Si(O-\overset{CH_3}{\underset{|}{C}}=CH_2)_3$$

$$CH_3CH_2-Si(O-\overset{CH_3}{\underset{|}{C}}=CH_2)_3$$

Example of the resist that can be used in the first embodiment includes a first type three-component system chemically amplified resist including an acid generator, an alkali-soluble resin and a compound or resin that is crosslinked by a function of an acid.

Examples of the resist that can be used in the second embodiment include a general resist including a naphthoquinone diazido compound and a novolak resin; a two-component system chemically amplified resist including an acid generator and a resin that is changed to be alkali-soluble by a function of an acid; a second type three-component system chemically amplified resist including an acid generator, an alkali-soluble resin and a compound or resin that is changed to be alkali-soluble by a function of an acid.

An example of the commercially available two-component system chemically amplified resist includes TDUR-DP007 manufactured by Tokyo Ohka Kogyo Co., Ltd, examples of the first type three-component system chemically amplified resist include XP-8843 and SAL-601 manufactured by Shipley Company, and examples of the commercially available second type three-component system chemically amplified resist include DX561 and DX981 manufactured by Clariant Japan Ltd.

Examples of the components of the chemically amplified resists will now be described, and it is noted that these exemplified components do not limit the invention.

<Two-component system chemically amplified resist>

Resin that is changed to be alkali-soluble by a function of an acid:
poly(t-butoxycarbonyloxystyrene-co-hydroxystyrene)
poly(t-butoxycarbonylmethyloxystyrene-co-hydroxystyrene)
poly(tetrahydropyranyloxystyrene-co-hydroxystyrene)
poly(2-methyl-2-adamantylmethacrylate-co-3-oxocyclohexylmethacrylate)

Acid generator:
Onium salt, nitrobenzyl sulfonate

<First type three-component system chemically amplified resist>

Alkali-soluble resin:
polyvinylphenol, polymethacrylic acid

Compound or resin that is crosslinked by a function of an acid:
melamine compound, melamine resin Acid generator:
Onium salt, nitrobenzyl sulfonate <Second type three-component system chemically amplified resist>

Alkali-soluble resin:
polyvinylphenol, polymethacrylic acid

Resin or compound that is changed to be alkali-soluble by a function of an acid:
poly(t-butoxycarbonyloxystyrene-co-hydroxystyrene)
poly(t-butoxycarbonylmethyloxystyrene-co-hydroxystyrene)
poly(tetrahydropyranyloxystyrene-co-hydroxystyrene)

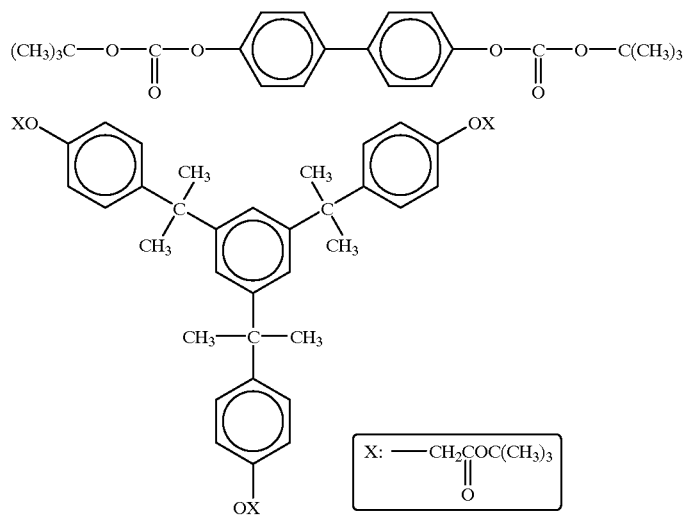

- Acid generator:
Onium salt, nitrobenzyl sulfonate

What is claimed is:

1. A pattern formation method comprising:

a first step of forming a resist film by coating a semiconductor substrate with a resist;

a second step of conducting pattern exposure on said resist film;

a third step of forming a silylated layer in an unexposed portion of said resist film not exposed in the pattern exposure by supplying a silylation agent including a silane compound represented by the following general formula (1) onto a surface of said resist film having been subjected to the pattern exposure:

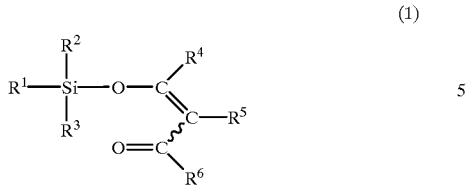

(1)

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms), a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and a fourth step of forming a resist pattern out of said resist film by removing an exposed portion of said resist film exposed in the pattern exposure through etching of said resist film by using said silylated layer as a mask.

2. The pattern formation method of claim 1, wherein said resist used in said first step is a chemically amplified resist including an acid generator, an alkali-soluble resin and a compound or resin that is crosslinked by a function of an acid.

3. A pattern formation method comprising:

a first step of forming a resist film by coating a semiconductor substrate with a resist;

a second step of conducting pattern exposure on said resist film;

a third step of forming a silylated layer in an exposed portion of said resist film exposed in the pattern exposure by supplying a silylation agent including a silane compound represented by the following general formula (1) onto a surface of said resist film having been subjected to the pattern exposure:

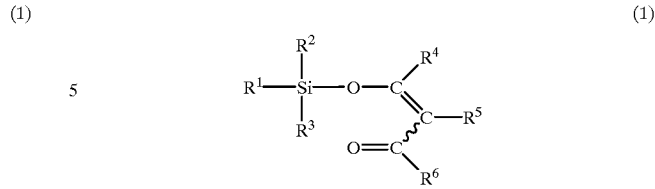

(1)

wherein $R^1$, $R^2$ and $R^3$ are the same different groups selected from the group consisting of a hydrocarbon atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrocarbon atom, $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms), a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and a fourth step of forming a resist pattern out of said resist film by removing an unexposed portion of said resist film not exposed in the pattern exposure through etching of said resist film by using said silylated layer as a mask.

4. The pattern formation method of claim 3, wherein said resist used in said first step is a chemically amplified resist including an acid generator and a resin that is changed to be alkali-soluble by a function of an acid.

5. The pattern formation method of claim 3, wherein said resist used in said first step is a chemically amplified resist including an acid generator, an alkali-soluble resin and a compound or resin that is changed to be alkali-soluble by a function of an acid.

6. The pattern formation method of claim 3, wherein said resist used in said first step includes a naphthoquinone diazido compound and a novolak resin.

\* \* \* \* \*